United States Patent [19]
Ishida et al.

[11] Patent Number: 5,151,008
[45] Date of Patent: Sep. 29, 1992

[54] SUBSTRATE TRANSFER APPARATUS

[75] Inventors: Toshimichi Ishida; Masaki Suzuki, both of Hirakata, Japan

[73] Assignee: Matsushita Electric Industrial Co., Ltd., Osaka, Japan

[21] Appl. No.: 703,777

[22] Filed: May 21, 1991

[30] Foreign Application Priority Data

May 25, 1990 [JP] Japan .................. 2-135908

[51] Int. Cl.⁵ .............................. B25J 18/00
[52] U.S. Cl. .................. 414/744.5; 901/15; 901/25; 414/917; 414/749; 74/479
[58] Field of Search ...... 414/744.5, 917, 749; 74/479; 901/15, 25

[56] References Cited
U.S. PATENT DOCUMENTS 4,293,272 10/1981 Jellema .............. 414/744.5
4,749,330 6/1988 Hine ................... 414/744.5

FOREIGN PATENT DOCUMENTS 1-157547 6/1989 Japan .
1-183383 7/1989 Japan .

Primary Examiner—Robert J. Spar
Assistant Examiner—Donald W. Underwood
Attorney, Agent, or Firm—Wenderoth, Lind & Ponack

[57] ABSTRACT

A substrate transfer apparatus includes two transfer arms pivotably arranged on a support table on opposite sides from each other with respect to a center of the support table. Each of the transfer arms includes: a first set of parallel links, a second set of parallel links, and a substrate holding member. The first set of the links is pivotably connected to the second set of the links at one ends thereof. The other ends of the first set of the links are pivotably connected to the support table. The substrate holding member is provided on the other end of the second set of the links. The each of the substrate holding members moves outward from the support table by stretching of the transfer arms and returns to the support table by bending of the transfer arms, and the transfer arms are bent in an opposite direction to each other with respect to the support table.

3 Claims, 4 Drawing Sheets

SUBSTRATE TRANSFER APPARATUS

BACKGROUND OF THE INVENTION

The present invention relates generally to a substrate transfer apparatus for transferring substrates such as semiconductor wafers, and more particularly, to a substrate transfer apparatus for transferring substrates in order to load/unload substrates onto/from a predetermined position in a processing chamber for conducting processing such as etching and the like on substrates in the manufacturing process of semiconductor elements such as integrated circuits.

Semiconductor wafers are thin disks usually made of silicon and the like, and on the semiconductor wafers, desired integral circuits are made by utilizing dry etching, chemical vapor deposition, hereinafter CVD, and other processing techniques. Since the interior of the wafer processing chamber is required to be maintained usually at a vacuum or with a strictly controlled atmosphere containing gas, the processing chamber is of an airtight structure and the space therein is confined. For this reason, the apparatus transferring semiconductor wafers within the processing chamber is required to be as compact as possible. Furthermore, the semiconductor transferring apparatus is also required to generate as little dust, friction powder, etc., as possible so that foreign materials will not adhere to semiconductor wafers or impurities will not be mixed into the thin film formed on the surface thereof.

The conventional semiconductor wafer transfer apparatus is arranged so that a semiconductor wafer holding member is provided on the tip end of a transfer arm having a plurality of joints and the holding member is moved by bending the joints. Concretely, there are transfer apparatuses having such structures as disclosed in the Japanese Laid-open Patent Publication Nos. 1-157547 and 1-183383.

However, since the conventional semiconductor transfer apparatus has only one transfer arm provided in the processing equipment, it has a drawback that the transfer operation takes time and thus the entire processing time becomes long.

Namely, the usual processing equipment has a plurality of reaction chambers or processing chambers, and transfers semiconductor wafers sequentially to respective processing chambers so as to conduct respective processing steps in respective chambers. With one transfer arm, however, it is necessary to repeat an operation in which, for example, after taking out a semiconductor wafer from the final processing chamber, the transfer arm is returned to the previous processing chamber to the final processing chamber so as to take out another semiconductor wafer from the previous processing chamber, the arm is moved to the final processing chamber to transfer the semiconductor thereto, and the arm is again returned to the processing chamber before the previous processing chamber. Therefore, a troublesome and time-consuming operation in which semiconductor wafers are transferred one by one by reciprocating the transfer arm many times to respective processing chambers, has been conducted conventionally.

Accordingly, an essential object of the present invention is to provide a substrate transfer apparatus which is capable of efficiently conducting a transfer operation for substrates such as semiconductor wafers or the like within the processing equipment without reciprocatingly moving the transfer arms many times.

SUMMARY OF THE INVENTION

In order to overcome the above-described drawback, according to the present invention, there is provided a substrate transfer apparatus comprising two transfer arms pivotably arranged on a support table on an opposite sides to each other with respect to a center of the support table,
each of the transfer arms comprising:
   a first set of parallel links;
   a second set of parallel links, the first set of the links being pivotably connected to the second set of the links at one ends thereof, the other ends of the first set of the links being pivotably connected to the support table; and
   a substrate holding member provided on the other end of the second set of the links;
   wherein each of the substrate holding member moves outward from the support table by stretching of the transfer arms and returns to the support table by bending of the transfer arms, and the transfer arms are bent in an opposite direction to each other with respect to the support table.

According to the above construction, when the two transfer arms are installed in a substrate processing equipment, it is possible to conduct, at one processing position, a substrate loading and unloading operation in one process sequentially and continuously by alternately using the two transfer arms. Namely, in the state that a substrate to be loaded next is held by one of the transfer arms, a substrate which has been processed is taken out by the other of the transfer arms, and without moving the whole transfer arm structure, that is, the support table, the substrate held by the one of the transfer arms may be immediately loaded onto the processing position. Preferably, the substrate taken out by the other of the transfer arms is moved to the next processing position by turning the support table while the substrate is being held by the transfer arm. And the above-described series of operations may be repeated.

As described hereinabove, the substrate loading and unloading operation at one processing position is conducted in one process sequentially and continuously by the two transfer arms, and the support table may be moved to the next processing position each time the substrate loading and unloading operation at one processing position has been completed, and there is no need to reciprocate the support table, namely, the whole transfer arm structure, many time among a plurality of processing positions.

However, when a plurality of transfer arms entering and leaving the same processing position are installed, there is a possibility that the transfer arms will collide or interfere with each other. Therefore, in one aspect of the present invention, the transfer arms are preferably arranged to take the substrate holding member into and out of the processing position by bending and stretching the two sets of the parallel links, and, further, the transfer arms are arranged to be bent outward alternately to each other, whereby the working ranges of respective transfer arms are positively isolated from each other.

BRIEF DESCRIPTION OF THE DRAWINGS

These and other objects and features of the present invention will become apparent from the following description taken in conjunction with the accompanying drawings, in which.

DETAILED DESCRIPTION OF THE INVENTION

Figure 1:
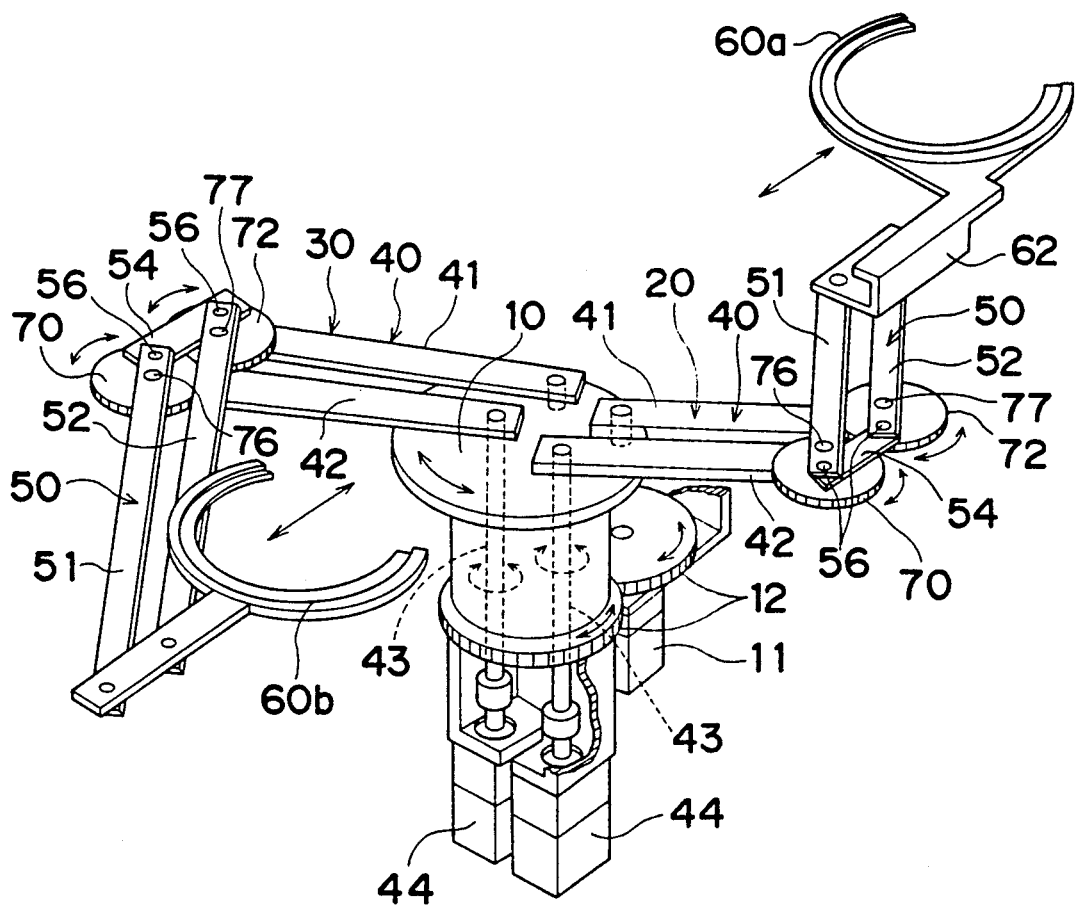
FIG. 1 is a perspective view showing the entire transfer apparatus according to one embodiment of the present invention.

Before the description of the present invention proceeds, it is to be noted that like parts are designated by like reference numerals throughout the accompanying drawings.

FIG. 1 shows the construction of the entire transfer apparatus according to one embodiment of the present invention, which is provided with a rotary table 10 turned by a drive motor 11 through a gear mechanism 12, as the support table for supporting transfer arms 20 and 30. As the drive motor 11, a pulse motor which is able to turn the rotary table 10 exactly through a predetermined angle is preferable. On the rotary table 10, two pairs of transfer arms 20, and 30 are provided. Respective transfer arms 20 and 30 are composed of two sets of parallel link mechanisms 40 and 50 connected to each other, with C-shaped substrate holding members 60a and 60b provided on the tip ends thereof as the portions for holding semiconductor substrates. The heights of the holding members 60a and 60b on the transfer arms 20 and 30 are different.

The parallel link mechanism 40 is arranged so that a pair of long links 41 and 42 are rotatively supported on the rotary table 10, and a drive shaft 43 serving as the center of rotation of one of the links 42 is connected to a vertical shaft drive motor 44 installed below the rotary table 10, and the link 42 is turned by the drive motor 44 through the drive shaft 43. For this drive motor 44, similarly to the drive motor 11 for the rotary table 10, a pulse motor or the like whose angle of rotation can be exactly set is preferable. The ends of the links 41 and 42 are rotatively connected respectively to a pair of links 51 and 52 of the other parallel link mechanism 50. The tip ends of links 51 and 52 are rotatively connected to C-shaped substrate holding members 60a and 60b respectively. At the connection positions between the links 41 and 42 and the links 51 and 52, there are provided gears 70 and 72, which are engaged with each other at a gear ratio of 1:1. The gear 70 is fixed to the link 52, while the gear 72 is fixed to the link 52. The links 51 and 52 are extended beyond the gears 70 and 72, and rotatively connected to each other with a short link 54.

Figure 3:
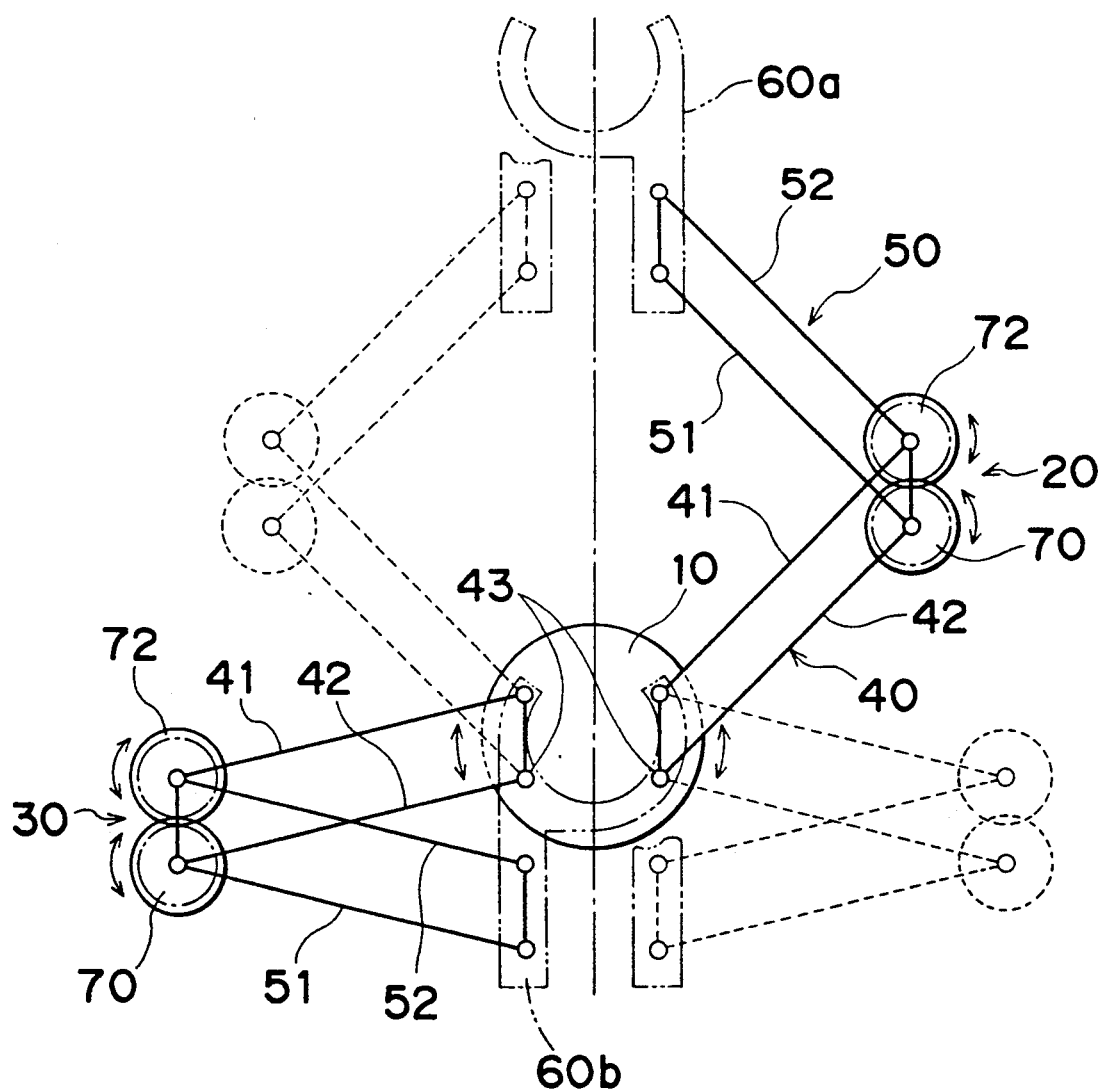
FIG. 3 is an explanatory drawing showing the operation of the transfer apparatus of FIG. 1.

FIG. 3 shows the operation of the transfer arms 20 and 30 having a construction as described above, and the parallel link mechanism 40 having the links 41 and 42 as longer links and the parallel link mechanism 50 having the links 51 and 52 as longer links the mechanisms having a shorter link in common at the positions of the gears 70 and 72. And at this common link, the gear 70 fixed to the link 42 and the gear 72 fixed to the link 52 are meshed with each other. When the parallel link mechanism 40 is turned, by meshing of gears 70 and 72, the parallel link 50 is turned through the same angle in the direction opposite to the rotation of the parallel link 40. As a result, the right and left transfer arms 20 and 30 are bent outward relative to each other, and the holding members 60a and 60b are moved parallel linearly in a direction parallel to the shorter link of the parallel link mechanisms.

The present invention can be modified arbitrarily with respect to the shapes and arrangements of respective links 41, 42, and 51, 52 of the parallel link mechanisms 40 and 50 so long as the operation mechanism as described above can be carried out.

For example, in the illustrated embodiment, although the gears 70 and 72 have teeth all around the circumference thereof, the gears 70 and 72 may be meshed with each other in the turning range of the parallel link mechanisms 40 and 50, as is clear from the above-described description of the operation mechanism, with no gear teeth being provided on the non-meshing portions, or gear wheels having no circular gear portions on parts thereof may be used as the gears 70 and 72.

Furthermore, in the illustrated embodiment, although a pair of gears 70 and 72 are used to bend and stretch two sets of the parallel links 40 and 50, the mechanism may be modified to various known operation mechanism using such elements as pulley belts or wires, so long as two connected sets of parallel links 40 and 50 can be bent and stretched thereby. However, with the mechanism using a pair of gears, the parallel links can be operated certainly with a very simple construction, and since friction is small, there is little possibility that dust or friction powder is generated within the processing equipment.

Since a pair of transfer arms 20 and 30 are arranged on the same plane on the right and left sides of the center of the rotary table 10 and are capable of bending outward, respectively, that is, in the opposite direction to each other, there is no possibility that the arms 20 and 30 will collide or interfere with each other. Since the substrate holding members 60a and 60b of the transfer arms 20 and 30 are at different heights, the holding members 60a and 60b effect linear motions while passing each other above and below. Namely, as shown in FIG. 1, the one of the substrate holding members 60a is provided at a position a little higher than the parallel link mechanism 50 through a J-shaped frame portion 62, while the other substrate holding member 60b is provided at a position immediately above the parallel link mechanism 50, whereby the substrate holding member 60b passes through the inner recess of the J-shaped frame portion 62 of the substrate holding member 60a, and thus the substrate holding members 60a and 60b pass each other above and below.

Next, the detailed construction of the transfer apparatus will be described below.

Figure 4:
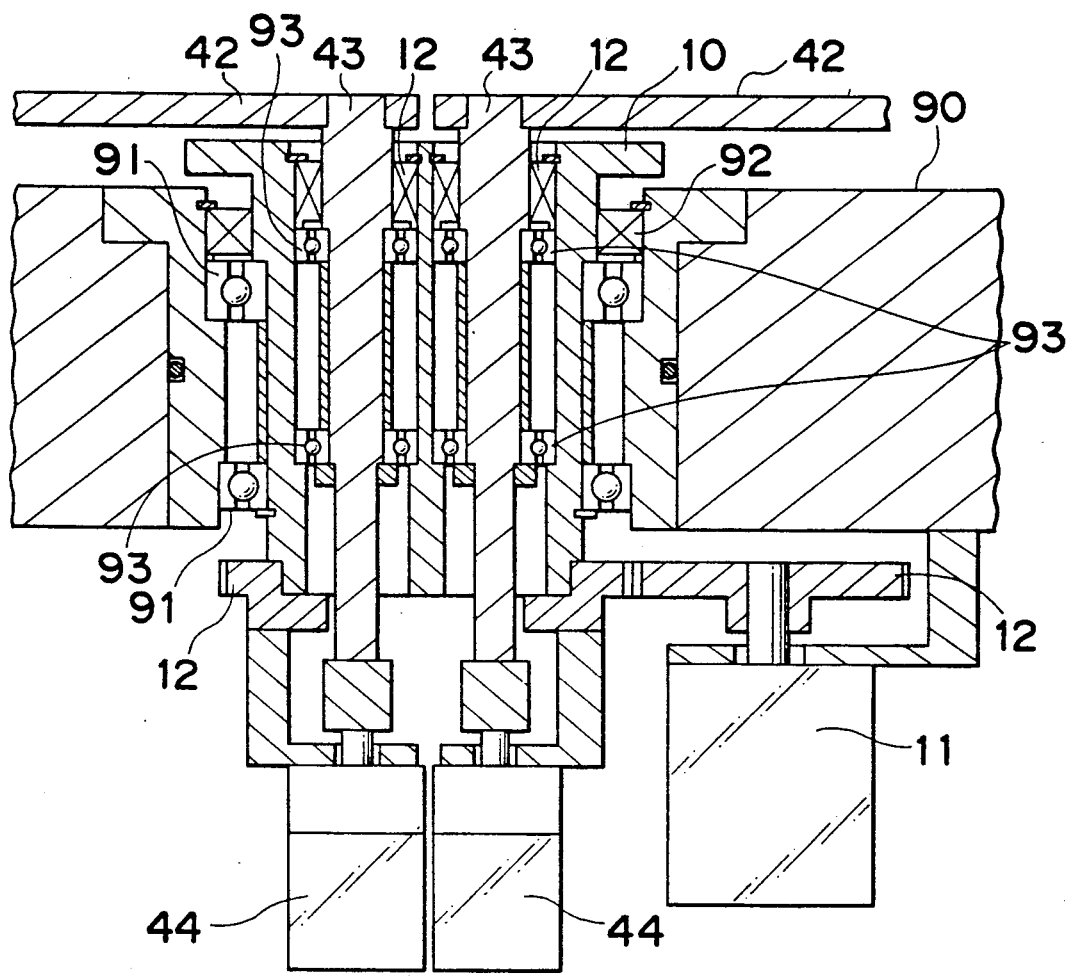
FIG. 4 is a sectional view showing the detailed structure of the transfer apparatus of FIG. 1.

FIG. 4 shows the construction in the vicinity of the rotary table 10, which is supported on a frame portion 90 of the transfer chamber 82 in bearings 91. There is provided a magnetic fluid seal 92 on the chamber side of the bearing 91 in order to seal the bearing 91 so that vacuum leakage will not take place therethrough. However, instead of the magnetic fluid seal 92, sealing means such as a conventional oil seal or O-ring may be provided. Below the rotary table 10, the drive motor 11 is connected to the rotary table 10 through the gears 12. The drive motor 11 is fixed to the frame portion 90. In the inner port of the rotary table, there are provided the drive shafts 43 for turning the links 42. Each drive shaft 43 is supported on the rotary table 10 in bearings 93, with the magnetic fluid seal 92 being provided on the chamber side of the bearings 93. Each drive shaft 43 is connected to the drive motor 44 fixed to the lower portion of the rotary table 10. The support structures and drive mechanisms for the rotary table 10 and the drive shafts 43 are not limited to the embodiment illustrated but may be modified to various structures common in such machinery and equipment.

Figure 6:
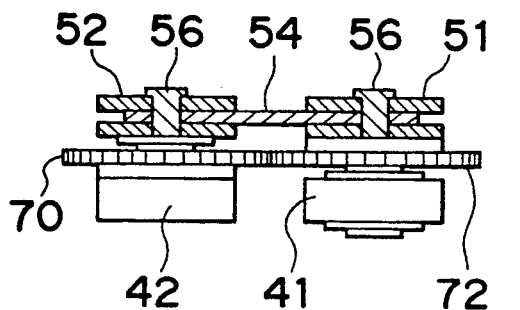
FIG. 6 is a sectional view showing the detailed structure of the connection portion of the parallel link mechanisms.
Figure 5:
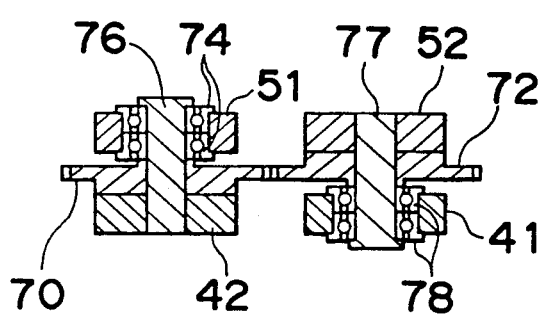
FIG. 5 is a sectional view showing the detailed structure of the gear portion.

FIGS. 5 and 6 show the structure of the connection portion between the parallel link mechanisms 40 and 50.

As shown in FIG. 5, the link 42 and the gear 70 are integrally fixed to each other, and the link 51 is rotatively connected to a shaft 76 extending through the centers of the link 42 and the gear 70 in bearings 74. Meanwhile, the link 52 and the gear 72 are integrally fixed to each other, and the link 41 is rotatively connected to a shaft 77 extending through the centers of the link 52 and the gear 72 in bearings 78. Therefore, when the link 42 is turned, the gear 70 is turned relative to the gear 72, and the gear 72 meshing with the gear 70 at a gear ratio of 1:1 is turned in the opposite direction to that of the gear 70, whereby the link 52 fixed to the gear 72 is turned in the direction opposite to the link 42 so as to linearly translate the holding member 60a or 60b.

FIG. 6 shows the connection portion between the links 51 and 52, wherein both ends of the short link 54 are rotatively connected to the links 51 and 52 through connection shafts 56. Although this short link 54 connects the links 51 and 52 at positions on the outside of the positions where the gears 70 and 72 engage with the links 51 and 52, when the shafts 76 of the gears 70 and 72 are also used for the shafts 56 of the short link 54, the short link 54 may be arranged at a position connecting the centers of the gears 70 and 72.

Figure 2:
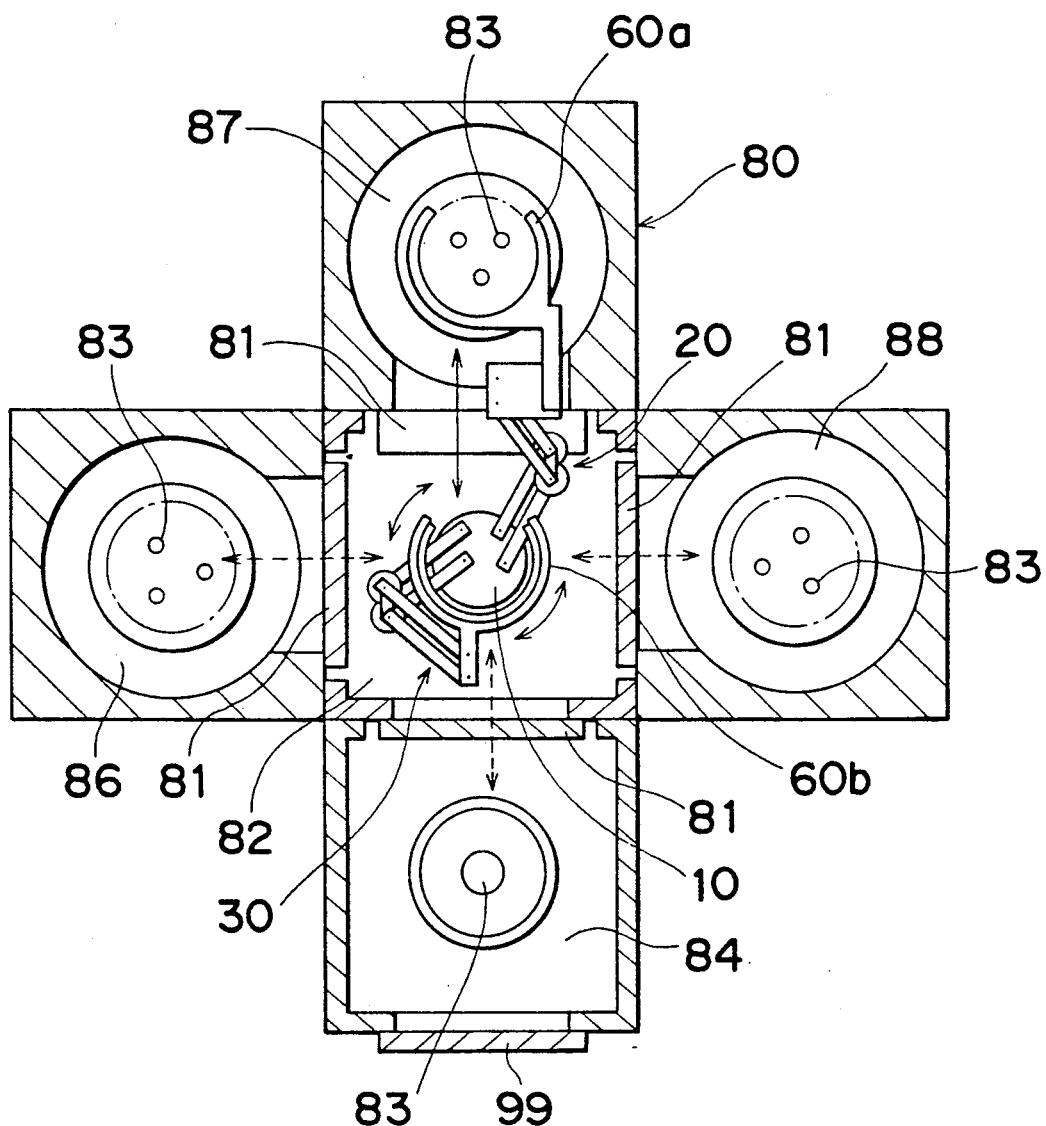
FIG. 2 is a plan view partly in section of a complete processing equipment installed with the transfer apparatus.

FIG. 2 shows structure of a semiconductor processing equipment 80 wherein the above-described transfer apparatus is installed.

The processing equipment 80 is provided with a preparatory chamber 84 and a plurality of processing chambers 86, 87, and 88 around a transfer chamber 82 with the transfer apparatus installed therein. Respective chambers are closed by gates 81 so as to be tightly sealed, and further, the preparatory chamber 84 is provided with a gate 99 communicating to the outside. In respective processing chambers 86 to 88 and the preparatory chamber 84, there are provided vertically movable transfer pins 83 for placing semiconductor wafers thereon.

After being transferred first to the preparatory chamber 84, semiconductor wafers are sequentially transferred to respective processing chambers 86 to 88 by the transfer apparatus in the transfer chamber 82 so as to be treated by predetermined processes, and thereafter, returned to the preparatory chamber for the delivery to the outside.

The transfer operation will be described in detail below. First, the motor 11 is driven to turn the gears 12 and thus the rotary table 10 is turned so as to direct the transfer arms 20 and 30 toward the preparatory chamber 84 and so as to be capable of moving thereinto, and by one transfer arm 20 or 30, a semiconductor substrate is received in the preparatory chamber 84. Next, the motor 11 is driven to turn the gears 12 and then the rotary table 10 is turned through a certain angle so as to direct the transfer arm 20 or 30 into the first processing chamber, for instance, into the processing chamber 86. Then, by rotation of one of the shafts 43 in one direction, the empty holding member 60b or 60a of the transfer arm 30 or 20 linearly moves into the processing chamber 86, and a semiconductor wafer which has been processed in the processing chamber 86 is received in the empty holding member 60b or 60a of the transfer arm 30 or 20, and by reverse rotation of that shaft 43 the holding member 60b or 60a of the transfer arm 30 or 20 having the semiconductor wafer thereon linearly moves out of the processing chamber 86. Thereafter or while moving the holding member 60b or 60a out thereof, the other holding member 60a or 60b of the transfer arm 20 or 30 is linearly moved into the processing chamber 86 by rotation of the other shaft 43 and then the semiconductor wafer held on the other holding member 60a or 60b of the transfer arm 20 or 30 which has been received in the preparatory chamber 84 therewith is transferred to the empty processing chamber 86, and the holding member 60a or 60b of the transfer arm 20 or 30 having no semiconductor wafer linearly moves out of the processing chamber 86 by reverse rotation of the other shaft 43. It is to be noted here that the gate 81 of the processing chamber 86 need be left opened only during the semiconductor wafer unloading and loading period. In comparison, in the case that the transfer apparatus has only one transfer arm, the gate is normally left opened throughout the period when the transfer arm reciprocates among processing chambers, so that the vacuum degree and gas atmosphere in each processing chamber will be changed, because, it is troublesome to conduct the gate opening/closing at both the unloading and loading of semiconductor wafers. On the contrary, when the unloading and loading of semiconductors wafers are continuously effected in a short time as in the present embodiment, there is little possibility that the atmosphere of the processing chamber is adversely affected by the transfer operation even though the gate remains open during the transfer operation.

By sequentially repeating the above-described operations of rotation of the rotary table 10, receiving of semiconductor wafers in the empty holding members 60a and 60b of the transfer arms 20 and 30, and loading of semiconductor wafers held by the holding members 60a and 60b of the transfer arms 20 and 30 into the processing chamber 86, the semiconductor wafers are subjected to necessary processings while the semiconductor wafers are moved through respective processing chambers from the preparatory chamber 84, and again returned to the preparatory chamber 84.

The constitution of the processing equipment is not limited to that illustrated here, and the number and arrangement of the processing chambers may be modified arbitrarily. Namely, two or less processing chambers or four or more processing chambers may be arranged around the transfer chamber 82, or a plurality of processing chambers can be arranged linearly, and within a transfer chamber communicating to all processing chambers, a support table installing transfer arms can move linearly. The transfer of semiconductor wafers is not limited to the transfer between processing chambers but even within the same processing chamber, semiconductor wafers may be transferred between processing positions different from each other.

It is to be noted here that although the present embodiment refers to semiconductor wafers as the substrate to be transferred, substrates made of glass, ceramics or metals may be also handled, and the shape thereof may be in any shape such as a circle or rectangle, so long as it can be transferred with the transfer arms.

As is clear from the foregoing description, the substrate transfer apparatus according to the embodiment of the present invention is capable of conducting the loading and unloading of substrates at one processing position sequentially and continuously in one process by alternately using the two transfer arms. Therefore, as compared with the conventional two step operation of substrate loading and unloading conducted by moving one transfer arm alternately to upstream and downstream processing positions, the transfer apparatus according to the embodiment of the present invention provides a far more efficient operation of substrate transfer.

As a result, the time required for the substrate transfer which has been a bottle neck to the efficiency improvement in the substrate processing operation can be shortened to a great extent, resulting in a great contribution to the efficiency improvement and time reduction of the entire substrate processing operation.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A substrate transfer apparatus comprising:
    two transfer arms pivotably mounted on a support table on opposite sides thereof from each other with respect to a center of the support table;
    each of the transfer arms having:
    a first set of parallel links;
    a second set of parallel links, a shaft pivotably connecting one end of each link in the first set of links to one end of a corresponding link in the second set of links, and a first gear fixed to one of the one ends of the first set of links, a second gear fixed to one of the one ends of the second set of links, said gears being engaged with each other, and a connecting link having each end connected to one of the shafts, the other ends of the first set of links being pivotably connected to the support table; and
    a substrate holding member provided on the other end of the second set of links;
    each of the substrate holding members being movable outward from the support table along a line by stretching of the transfer arms and being movable back to the support table by bending of the transfer arms, and the transfer arms being bent in the opposite direction to each other with respect to the support table.

2. The substrate transfer apparatus as claimed in claim 1, further comprising driving shafts for rotating the transfer arms, each driving shaft being connected to one of the other ends of a corresponding link of the first set of links, whereby rotation of the shafts causes the transfer arms to stretch so as to move the substrate holding members outward from the support table and causes the transfer arms to bend so as to return the substrate holding members to the support table.

3. The substrate transfer apparatus as claimed in claim 1, wherein one of the holding members is at a position which is higher than the position of the other of the holding members on one end of one of the link mechanisms in each transfer arm.

* * * * *